(12) United States Patent
Todaka (10) Patent No.: US 7,516,833 B2
(45) Date of Patent: Apr. 14, 2009

(54) MULTI-STATION WORKPIECE PROCESSORS, METHODS OF PROCESSING SEMICONDUCTOR WORKPIECES WITHIN MULTI-STATION WORKPIECE PROCESSORS, AND METHODS OF MOVING SEMICONDUCTOR WORKPIECES WITHIN MULTI-STATION WORKPIECE PROCESSORS

(75) Inventor: Ryoji Todaka, Shanghai (CN)

(73) Assignee: Advanced Micro-Fabrication Equipment, Inc. Asia, George Town, Grand Cayman (KY)

( * ) Notice: Subject to any disclaimer, the term of this patent is extended or adjusted under 35 U.S.C. 154(b) by 483 days.

(21) Appl. No.: 11/351,786

(22) Filed: Feb. 9, 2006

(65) Prior Publication Data

US 2007/0034479 A1    Feb. 15, 2007

(30) Foreign Application Priority Data

Aug. 11, 2005    (CN)    ......................... 2005 1 0028667

(51) Int. Cl.
*B65G 15/64* (2006.01)

(52) U.S. Cl. .............................. 198/345.1; 414/222.01; 414/223.01; 414/744.1; 118/729

(58) Field of Classification Search .............. 198/345.1, 198/345.2, 346.3; 414/223.01, 222.13, 222.01, 414/222.04, 222.05, 744.1, 744.2; 118/729, 118/730

See application file for complete search history.

(56) References Cited

U.S. PATENT DOCUMENTS

| 5,133,284 | A | 7/1992 | Thomas et al. |
| 5,230,741 | A | 7/1993 | van de Ven et al. |
| 5,238,499 | A | 8/1993 | van de Ven et al. |
| 5,302,209 | A | 4/1994 | Maeda et al. |
| 5,863,170 | A * | 1/1999 | Boitnott et al. ......... 414/222.13 |
| 5,944,940 | A * | 8/1999 | Toshima ................. 156/345.29 |
| 5,951,770 | A * | 9/1999 | Perlov et al. ........... 414/223.01 |
| 6,143,082 | A | 11/2000 | McInerney et al. |
| 6,305,898 | B1 | 10/2001 | Yamagishi et al. |
| 6,494,666 | B2 | 12/2002 | Wu et al. |
| 7,028,565 | B2 * | 4/2006 | Birkner et al. ............. 73/865.8 |
| 2004/0219006 | A1 | 11/2004 | Tran et al. |

* cited by examiner

*Primary Examiner*—James R Bidwell
(74) *Attorney, Agent, or Firm*—Nixon Peabody LLP; Joseph Bach, Esq.

(57) ABSTRACT

The invention includes multi-station workpiece processors, methods of processing semiconductor workpieces within multi-station workpiece processors, and methods of moving semiconductor workpieces within multi-station workpiece processors. In one implementation, a multi-station workpiece processor includes a processing chamber comprising multiple stations for processing individual workpieces. A pedestal is associated with individual of the stations. The pedestals are mounted for selective vertical up movement within the chamber to contact a workpiece and for selective vertical down movement within the chamber to be displaced from a workpiece. The pedestals respectively comprise an upper surface upon which an individual workpiece is received during processing within the chamber. At least one workpiece engagement arm is associated with individual of the pedestals. The workpiece engagement arms are movable between a position received at least partially over individual of the pedestals and a position displaced away from over all of the pedestals. Other aspects are contemplated.

29 Claims, 10 Drawing Sheets

MULTI-STATION WORKPIECE PROCESSORS, METHODS OF PROCESSING SEMICONDUCTOR WORKPIECES WITHIN MULTI-STATION WORKPIECE PROCESSORS, AND METHODS OF MOVING SEMICONDUCTOR WORKPIECES WITHIN MULTI-STATION WORKPIECE PROCESSORS

RELATED PATENT DATA

This application claims priority from Chinese Patent Application Ser. No. 200510028667.3, and which was filed on Aug. 11, 2005

TECHNICAL FIELD

This invention relates to multi-station workpiece processors, to methods of processing semiconductor workpieces within multi-station workpiece processors, and to methods of moving semiconductor workpieces within multi-station workpiece processors.

BACKGROUND OF THE INVENTION

Multi-station workpiece processors are used to process several workpieces within the same chamber, for example in the processing of semiconductor workpieces such as semiconductor wafers. Individual workpieces are positioned within individual processing stations within the chamber of the processor. The workpieces can be processed simultaneously using the same or different processing relative to the different workpieces, and/or at different times within the chamber. Such processing might include any one or combination of deposition, etching and other treatments whether existing or yet-to-be developed. The substrates during processing might be heated, cooled, held at a desired potential and/or subject to plasma or non-plasma processing. By way of example only, exemplary multi-station workpiece processors are shown in U.S. Pat. Nos. 6,305,898; 6,143,082; 5,230,741; 5,133,284; and U.S Patent Publication 2004/0219006.

Precise positioning of individual workpieces within the individual processing stations is highly desirable. Lift pins are typically associated with individual processing stations. Such are raised and lowered relative to stationary pedestals for lifting and lowering the individual workpieces relative to the pedestals. In some instances, such action can undesirably move or displace the workpieces laterally relative to the pedestals.

While the invention was motivated in addressing some of the above identified issues, it is in no way so limited. The invention is only limited by the accompanying claims as literally worded, without interpretative or other limiting reference to the specification, and in accordance with the doctrine of equivalents.

SUMMARY

The invention includes multi-station workpiece processors, methods of processing semiconductor workpieces within multi-station workpiece processors, and methods of moving semiconductor workpieces within multi-station workpiece processors. In one implementation, a multi-station workpiece processor includes a processing chamber comprising multiple stations for processing individual workpieces. A pedestal is associated with individual of the stations. The pedestals are mounted for selective vertical up movement within the chamber to contact a workpiece and for selective vertical down movement within the chamber to be displaced from a workpiece. The pedestals respectively comprise an upper surface upon which an individual workpiece is received during processing within the chamber. At least one workpiece engagement arm is associated with individual of the pedestals. The workpiece engagement arms are movable between a position received at least partially over individual of the pedestals and a position displaced away from over all of the pedestals.

In one implementation, a multi-station workpiece processor includes a processing chamber comprising multiple stations for processing individual workpieces. A pedestal is associated with individual of the stations. First and second engagement arms are associated with individual of the stations. The first engagement arms are configured to engage respective first side portions of individual workpieces received over the pedestals. The second engagement arms are configured to engage respective second side portions opposite the first side portions of the individual workpieces received over the pedestals. The first and second engagement arms are configured for movement together in unison to move workpieces from one of the stations to another of the stations. The first engagement arms are also configured for movement relative to the second engagement arms. The second engagement arms are also configured for movement relative to the first engagement arms.

In one implementation, a method of processing semiconductor workpieces within a multi-station workpiece processor includes positioning individual semiconductor workpieces over individual pedestals within a multi-station processing chamber with at least one workpiece engagement arm associated with individual of the workpieces. Lift pins associated with individual of the pedestals are raised effective to engage respective undersides of the workpieces positioned thereover and lift the individual workpieces off of the engagement arms. After lifting the workpieces off of the engagement arms, the engagement arms are moved away from the workpieces. After lifting the workpieces off of the engagement arms, the pedestals are raised effective to contact the respective undersides of the individual workpieces and rest the workpieces onto surfaces of the pedestals. After resting the workpieces onto the surfaces of the pedestals, the workpieces are processed within the processing chamber.

In one implementation, a method of processing semiconductor workpieces within a multi-station workpiece processor includes positioning individual semiconductor workpieces over individual pedestals within a multi-station processing chamber with opposing pairs of first and second engagement arms associated with individual of the workpieces. The first engagement arms engage respective first side portions of the individual workpieces. The second engagement arms engage respective second side portions of the individual workpieces opposite the first side portions. After the positioning, the individual workpieces are lifted off of the first and second engagement arms with lift pins associated with the individual pedestals. After lifting the individual workpieces off of the first and second engagement arms, the first engagement arms are moved in unison relative to one another in one of clockwise or counterclockwise direction away from the workpieces. After lifting the individual workpieces off of the first and second engagement arms, the second engagement arms are moved in unison relative to one another in the other of clockwise or counterclockwise direction away from the workpieces. Respective undersides of the workpieces are rested onto the individual pedestals. After resting the workpieces onto the pedestals, the workpieces are processed within the processing chamber.

In one implementation, a method of moving semiconductor workpieces within a multi-station workpiece processor includes resting individual semiconductor workpieces onto individual pedestals within a multi-station processing chamber. The pedestals are lowered relative to lift pins associated with the individual pedestals effective to contact and support undersides of the workpieces by the lift pins above the pedestals. After lowering the pedestals, at least a portion of at least one workpiece engagement arm associated with individual of the workpieces is moved to underneath the individual workpieces. After moving at least a portion of the workpiece engagement arms to underneath the individual workpieces, the lift pins are lowered effective to rest the workpieces on the engagement arms. After resting the workpieces on the engagement arms, the workpieces with the engagement arms are moved within the processing chamber.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention encompasses multi-station workpiece processors, and methods of processing semiconductor workpieces within multi-station workpiece processors. The invention pertaining to the processors is and can be independent of the methods disclosed herein, as well as the methods disclosed herein being practicable independent of the exemplary processors disclosed herein.

Exemplary embodiment multi-station workpiece processors are described with reference to FIGS. 1-11. A first embodiment multi-station workpiece processor is described with reference to FIGS. 1-5 in connection with a processor indicated generally with reference 10. Referring the FIGS. 1 and 2, processor 10 comprises a processing chamber 14 defined by exemplary chamber walls 12. Chamber 14 includes multiple stations 16 for processing individual workpieces (not shown in FIGS. 1, 2). Four such stations 16 are shown, although fewer or more stations are of course contemplated. Processor 10 includes an access port 18 through which workpieces to be processed can enter and leave the chamber. Access port 18 is depicted as aligning with one of multiple stations 16, although other positioning is of course contemplated as is provision of more than one access port.

Pedestals 20 are associated with individual of stations 16. Such might be temperature controlled by heating and/or cooling, and/or powered at selected voltages if desired. Regardless, in one preferred embodiment, pedestals 20 are mounted for selective vertical up movement within chamber 14 to contact a workpiece and for selective vertical down movement within chamber 14 to be displaced from a workpiece. In the context of this document, any mounting for "movement" or "movements" of a component requires remote controllable movement of the component directed externally from chamber 14. For example and by way of example only, the component (in this example the pedestals) might be mounted for selective vertical movement electrically (i.e., by an electric motor), hydraulically, pneumatically or by any other operator controllable means whether existing or yet-to-be developed which is controllable from outside of chamber 14. In one implementation, the pedestals are mounted for vertical up and down movements in unison with one another. In one implementation, the pedestals are mounted to be capable of vertical up and down movements independent of one another.

Pedestals 20 respectively comprise an upper surface 22 upon which an individual workpiece is received during processing within chamber 14. An exemplary preferred workpiece for processing comprises a semiconductor workpiece, for example a semiconductor substrate such as a semiconductor wafer. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. The workpiece to be processed will typically comprise a shape corresponding to the depicted horizontal outline of the pedestals and perhaps be of slightly smaller size, although such is of course not required.

At least one workpiece engagement arm is associated with individual of the pedestals. The workpiece engagement arms are movable between a position received at least partially over individual of the pedestals and a position displaced away from over all of the pedestals. The FIGS. 1-5 embodiment depicts an implementation comprising only one workpiece engagement arm 25 per pedestal 20/workstation 16. In the depicted exemplary embodiment, workpiece engagement arms 25 are mounted for movement in one or both of rotational clockwise and counterclockwise directions, as is most-preferred, and can be positioned between and/or indexed over any pedestal 20/workstation 16. While rotational motion or indexing is most preferred, other constructions which provide movement other than rotation are also of course contemplated. Exemplary materials of construction for engagement arms 52 include ceramics, $Al_2O_3$, SiC and AlN.

Figure 1:
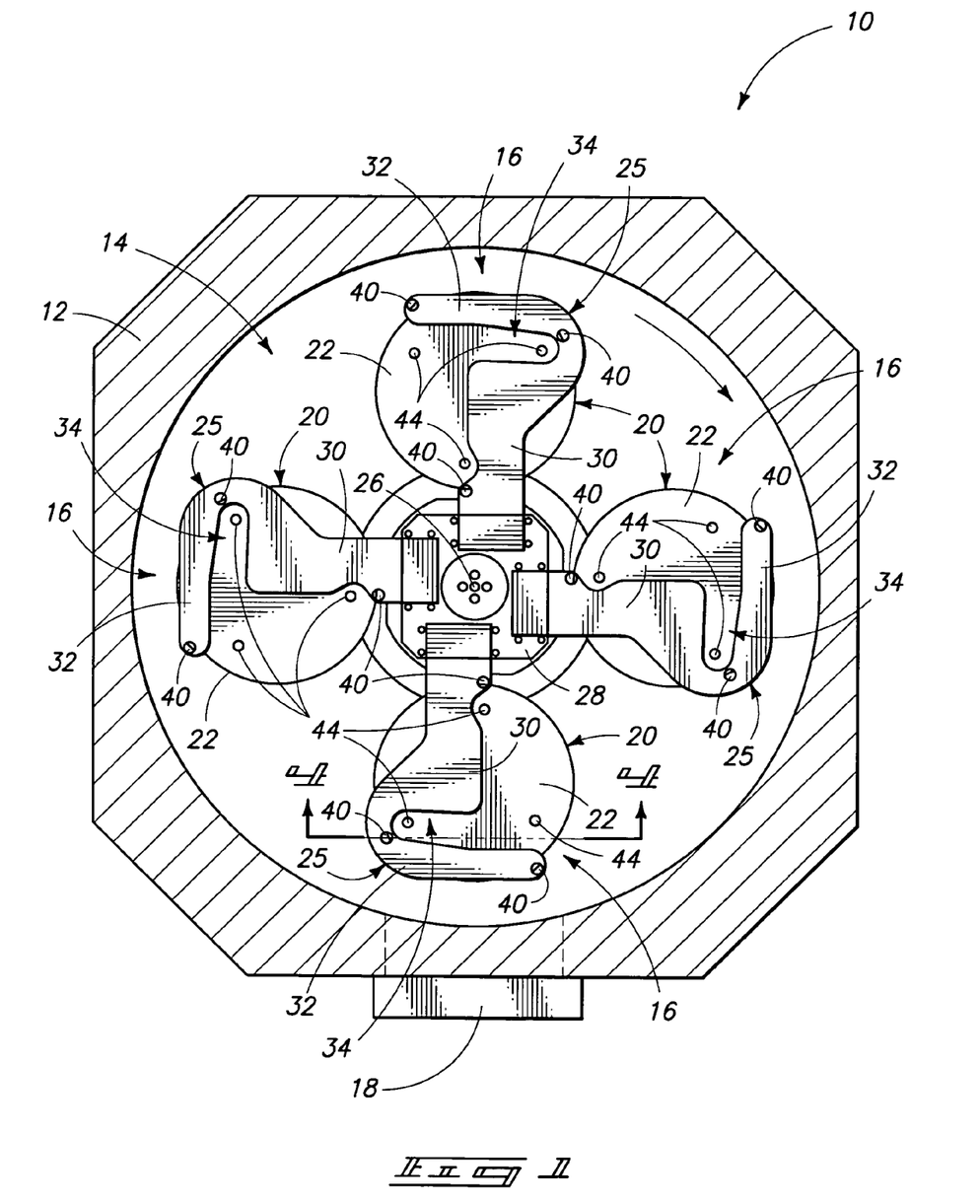
FIG. 1 is a diagrammatic sectional view of a multi-station workpiece processor in accordance with an aspect of the invention.
Figure 2:
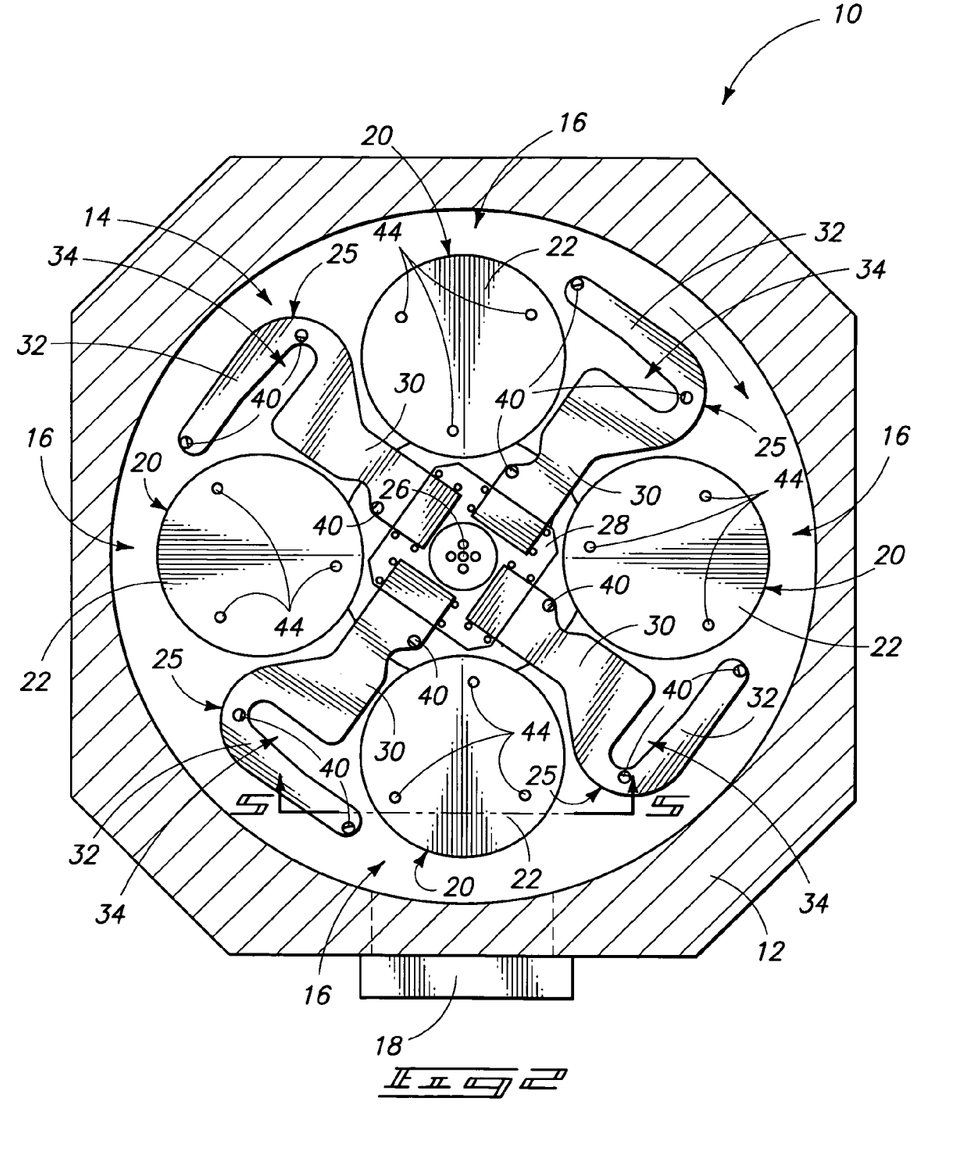
FIG. 2 is a view of the FIG. 1 processor in a different operational orientation to that depicted by FIG. 1.
Figure 3:
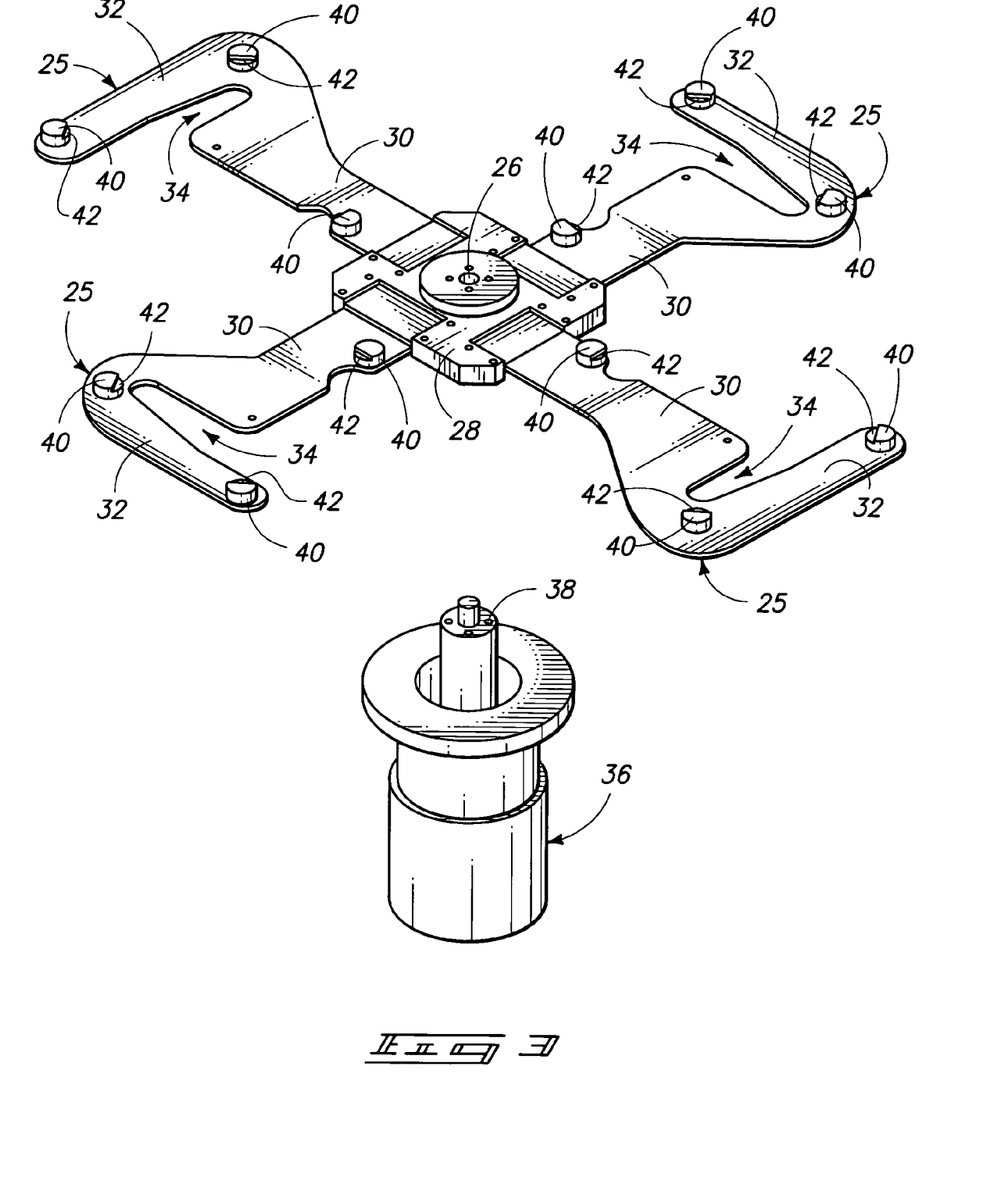
FIG. 3 is an exploded perspective view of certain components of the FIG. 1 processor.

Referring to FIGS. 1-3, engagement arms 25 are mounted for rotation about an axis of rotation 26. In the depicted preferred embodiment, rotation axis 26 is defined in part by an exemplary preferred central plate 28 to which engagement arms 25 are mounted. Exemplary engagement arms 25 are depicted as comprising a respective first portion 30 extending generally radially relative to axis of rotation 26 and a second portion 32 extending generally perpendicular to axis of rotation 26. In one preferred implementation as shown, a slot 34 is provided intermediate first portion 30 and second portion 32. Such is preferably provided to enable movement to and from over pedestal 16 without interfering with lift pins associated with the pedestals, as is described subsequently. First portions 30 of engagement arms 25 preferably removably mount to central plate 28, for example using locking screws and/or retaining plates, and whether existing or yet-to-be developed. An indexing motor or mechanism 36 (FIG. 3) advantageously includes a drive shaft 38 to which central plate 28 is ideally removably secured and defining of axis 26, for example as shown in but one exemplary embodiment in FIGS. 1-3.

Individual engagement arms 25 are depicted as comprising a plurality of upwardly projecting workpiece engaging portions 40. Such are depicted as comprising exemplary recessed surfaces 42 (FIG. 3) upon which a workpiece rests when received by an arm 25.

FIG. 1 depicts workpiece engagement arms 25 positioned to be received at least partially over individual of pedestals 20 in but one exemplary indexed position. FIG. 2 depicts individual arms 25 being positioned to be displaced away from over all of pedestals 16 in but one additional exemplary indexed position. FIGS. 1 and 2 depict exemplary and preferred respective pluralities of lift pins 44 which are associated with individual of pedestals 20. Such are depicted as being three in number for the individual pedestals, although of course fewer of more might be utilized. Lift pins 44 are preferably radially positioned, for example as shown, and individual arms 25 are preferably shaped, such that arms 25 can move over and away from pedestals 20 without interfering with lift pins 44 when such are raised relative to surface 22.

One or both of lift pins 44 and pedestals 20 are preferably configured for vertical/elevational movement relative to one another for engaging a workpiece, for example as will be described subsequently. In one implementation, lift pins 44 are preferably mounted for vertical up and down movement within respective holes formed in pedestals 20. In one implementation, all lift pins for all the pedestals might be mounted for vertical up and down movements in unison. Alternately by way of example only, the respective plurality of lift pins associated with the individual pedestals might be mounted to be capable of vertical up and down movements independent of movement of lift pins of other pedestals.

Figure 4:
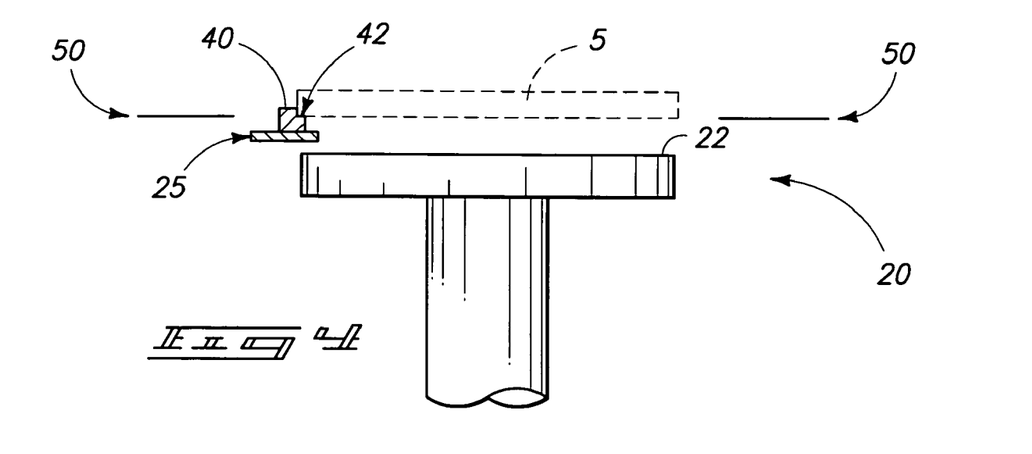
FIG. 4 is a diagrammatic sectional view taken through line 4-4 in FIG. 1.
Figure 5:
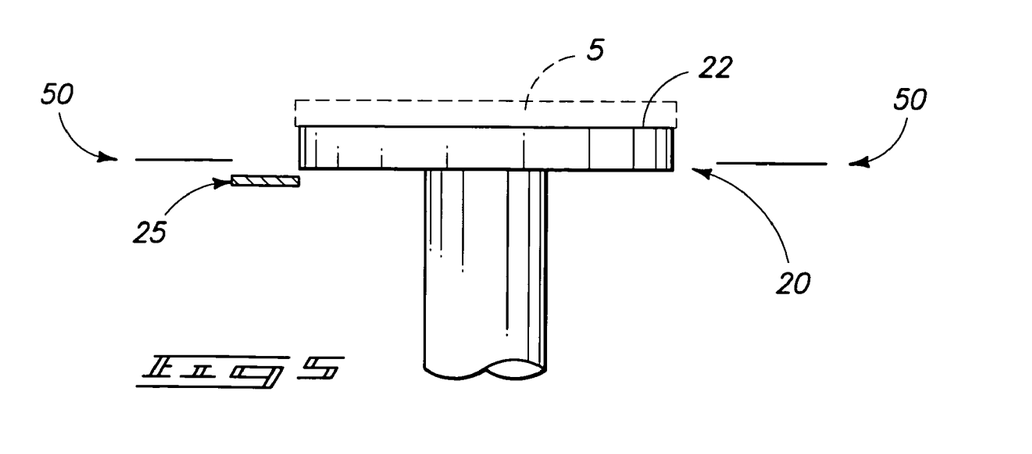
FIG. 5 is a diagrammatic sectional view taken through line 5-5 in FIG. 2.

Referring to FIGS. 1-5, individual arms 25 comprise at least some portion which is configured to contact an individual workpiece when engaging a workpiece. For example in the depicted described embodiment, surfaces 42 (i.e., FIGS. 3 and 4) of upwardly projecting workpiece engaging portions 40 constitute an exemplary such portion for engaging an exemplary workpiece 5 (FIG. 4). In one preferred embodiment, such portion is movable in at least one plane (i.e. horizontal plane 50) between a position received at least partially over individual of pedestals 20 (i.e. FIGS. 1 and 4), and a position displaced away from over all of pedestals 20 (i.e. FIGS. 2 and 5). Further in preferred embodiments, the pedestals are configured for upward movement such that upper surfaces 22 of pedestals 20 are upwardly movable at least to such plane and, even more preferably, upwardly movable through such plane. For example, FIG. 5 depicts a pedestal 20 as having been upwardly moved through plane 50 and engaging workpiece 5 when engagement arms 25 have been moved out of the way.

Aspects of the invention also include multi-station workpiece processors having at least two workpiece engagement arms per pedestal. By way of example only, exemplary such embodiments are described with reference to FIGS. 6-11 with respect to a multi-station workpiece processor 10a. Like numerals from the first described embodiment are utilized where appropriate, with differences being indicated with different numerals or the suffix "a". FIGS. 6-11 illustrate exemplary first engagement arms 52 and second engagement arms 54 associated with individual of pedestals 20/stations 16, thereby comprising two workpiece engagement arms per pedestal. In this depicted exemplary preferred embodiment, first engagement arms 52 are configured to engage respective first side portions of individual workpieces received over pedestals 20a, while second engagement arms 54 are configured to engage respective second side portions of the individual workpieces opposite the first side portions of the individual workpieces.

The first and second engagement arms 52, 54, respectively, are configured for movement together in unison to move workpieces from one of stations 16 to another of stations 16 within the chamber. First engagement arms 52 are also configured for movement relative to second engagement arms 54. Second engagement arms 54 are also configured for movement relative to first engagement arms 52. In one preferred embodiment, first engagement arms 52 are configured for movement together in unison independent of and relative to second engagement arms 54. In one preferred embodiment, second engagement arms 54 are configured for movement together in unison independent of and relative to first engagement arms 52. Further in but one preferred embodiment, such stated movements are preferably rotational, and in one preferred embodiment rotational about a common axis of rotation.

Figure 6:
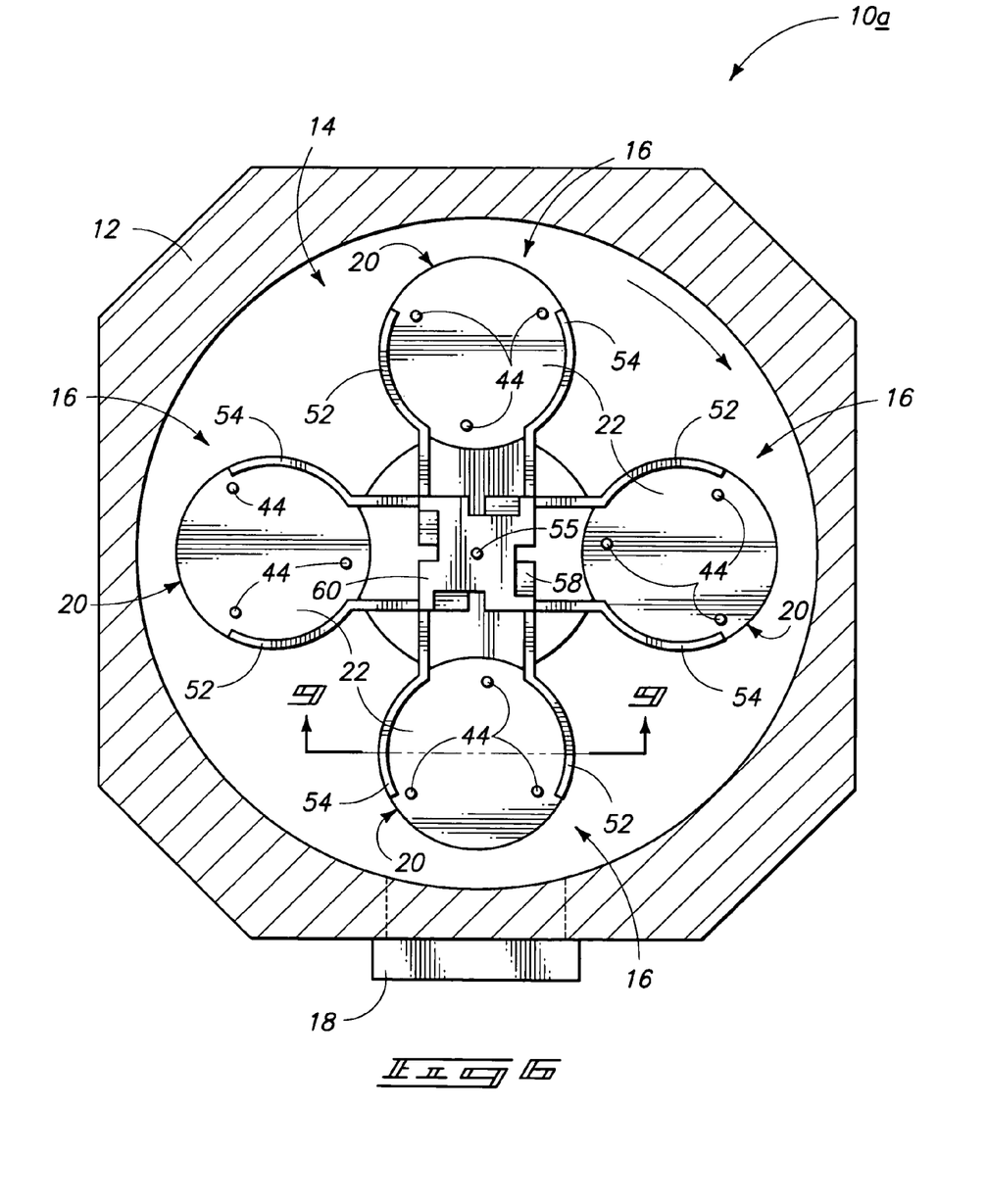
FIG. 6 is a diagrammatic sectional view of an alternate embodiment multi-station workpiece processor in accordance with an aspect of the invention.
Figure 7:
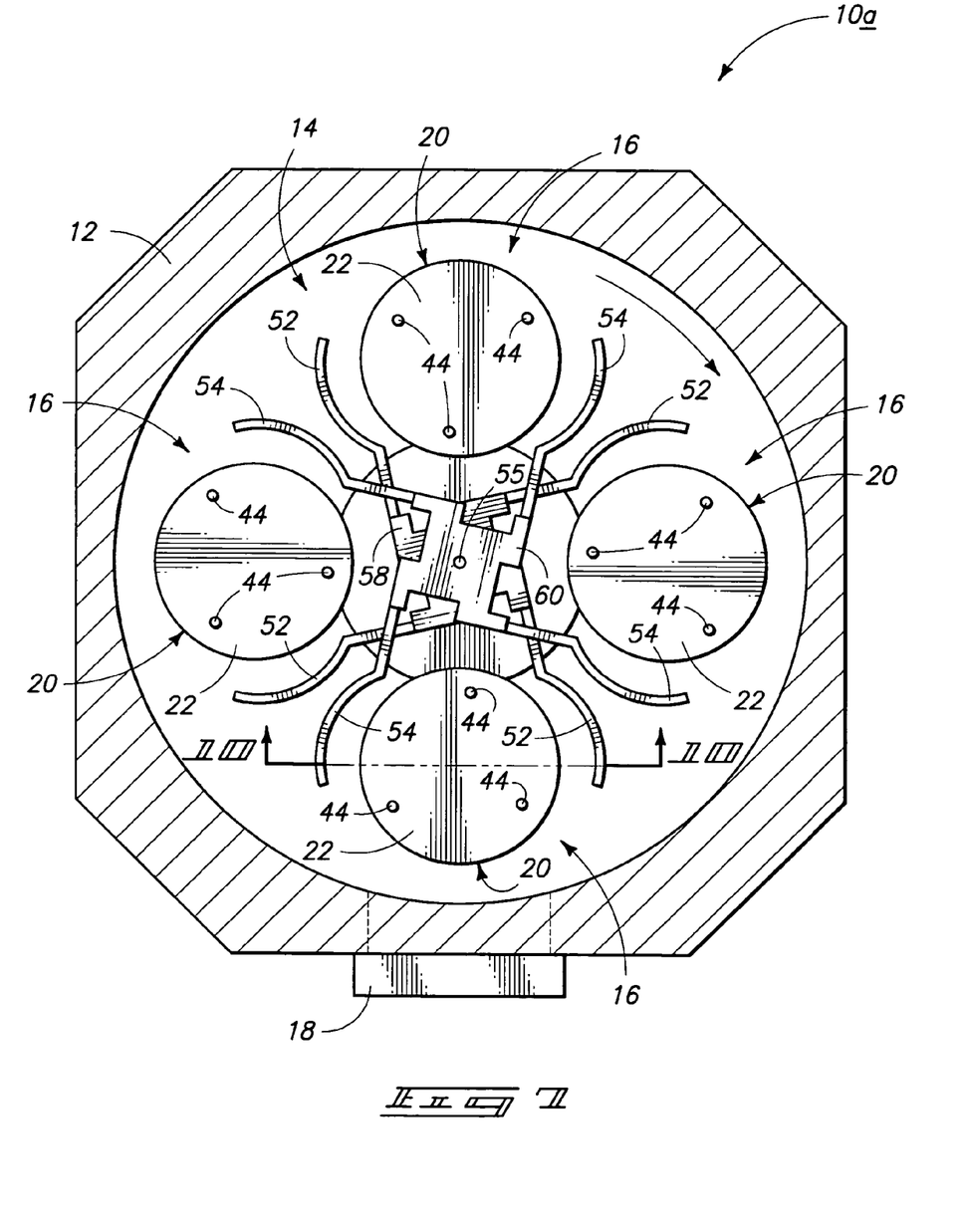
FIG. 7 is a view of the FIG. 6 processor in a different operational orientation to that depicted by FIG. 6.
Figure 8:
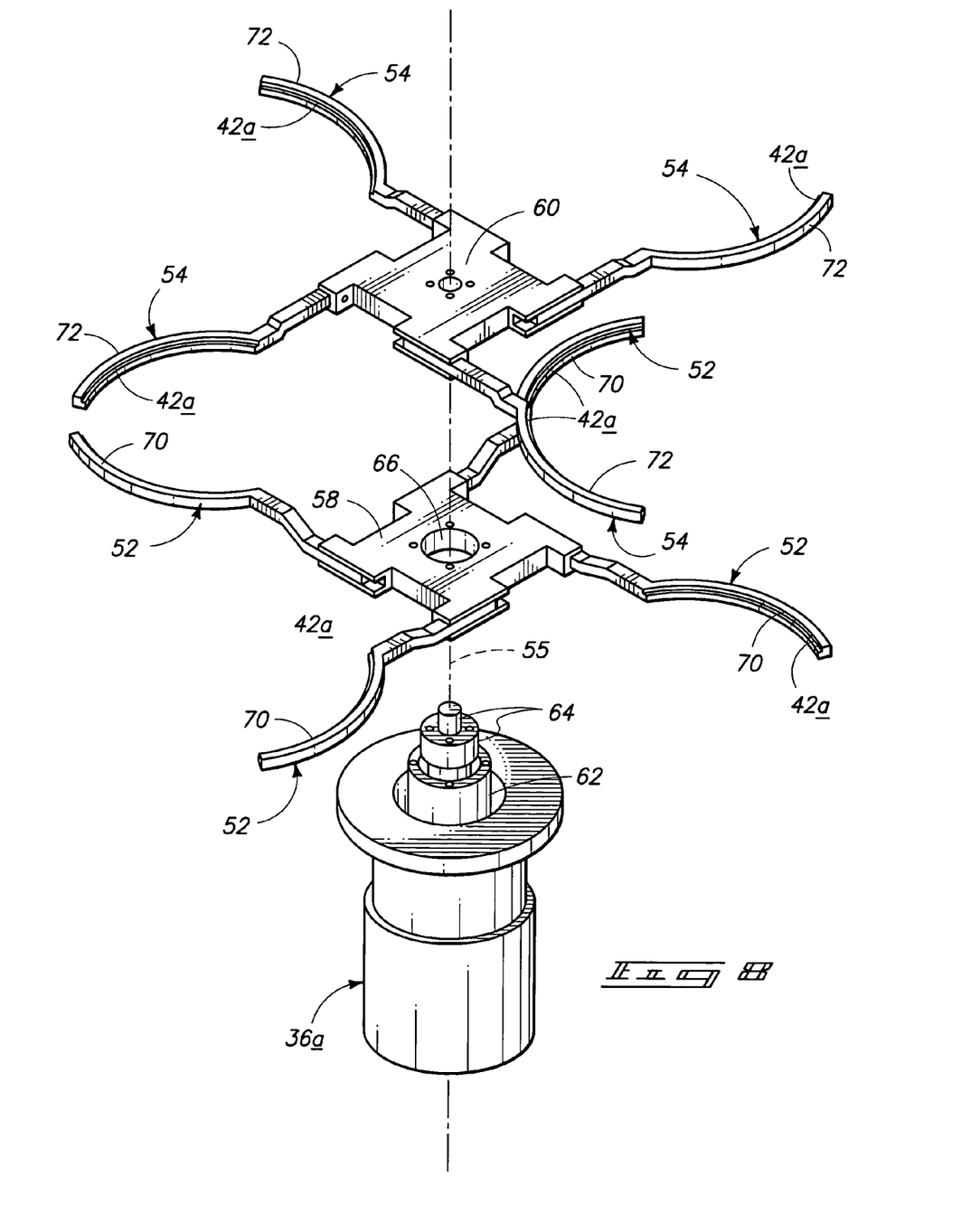
FIG. 8 is an exploded perspective view of certain components of the FIG. 6 processor.

For example and referring more particularly to FIGS. 6-8, first engagement arms 52 extend from a first central plate 58, and second engagement arms 54 extend from a second central plate 60. Drive mechanism 36a (FIG. 8) includes an indexing or rotating lower first drive shaft mechanism 62 which engages first central plate 58, and a higher, through-extending second drive shaft mechanism 64 which engages second central plate 60. First drive shaft portion 62 and second drive shaft portion 64 can be independently rotated in opposite directions relative to one another and in unison in the same direction relative to one another.

In one preferred embodiment, first central plate 58 includes a central opening 66 through which second drive shaft mechanism 64 is rotatably received. First central plate 58 preferably removably mounts to first drive shaft mechanism 62 with pins or bolts, for example relative to the four depicted aligned openings in central plate 58 and first mechanism 62 (not designated with numerals). Second drive shaft mechanism 64 is thereby independently rotatable within central opening 66 in first central plate 58. Second plate 60 mounts to second drive shaft mechanism 64, for example using mounting pins or bolts relative to the exemplary depicted four aligned openings in second plate 60 and second drive shaft mechanism 64 (not designated with numerals). Such provides but one exemplary construction whereby an upper of the first and second central plates is provided to be rotatable by a shaft extending rotatably through a lower of the first and second central plates. Degrees if rotation independent of one another is preferably at least from 7° to 15°. Further by way of example only, such depicts an exemplary embodiment whereby first and second central plates are mounted for rotation about a common axis of rotation 55, and are also mounted to do so in different elevational planes. The relationship of the first and second plates and their associated arms could of course be reversed or arranged in other configurations. The first or second engagement arms extending from an upper of the first and second central plates preferably extend downwardly to some degree, and the first or second engagement arms extending from a lower of the first and second central plates preferably extends upwardly to some degree, for example as depicted more clearly in FIG. 8 and in FIG. 9 such that a workpiece 5 when received by the arms is within the exemplary depicted horizontal plane 50a.

First engagement arms 52 are preferably removably mounted to first central plate 58, and second engagement arms 54 are preferably removably mounted to second central plate 60. By way of example only, such can be removably so mounted with set screws and/or pins. Further in the depicted preferred embodiment, first engagement arms 52 comprise respective arcuate-shaped portions 70, while second engagement arms 54 comprise respective arcuate-shaped portions 72. Each is configured to engage side portions of a workpiece. In the depicted preferred embodiment, such arcuate-shaped portions include a recessed arcuate ledge 42a sized and configured to engage respective undersides of outermost edges of the individual workpieces.

Figure 9:
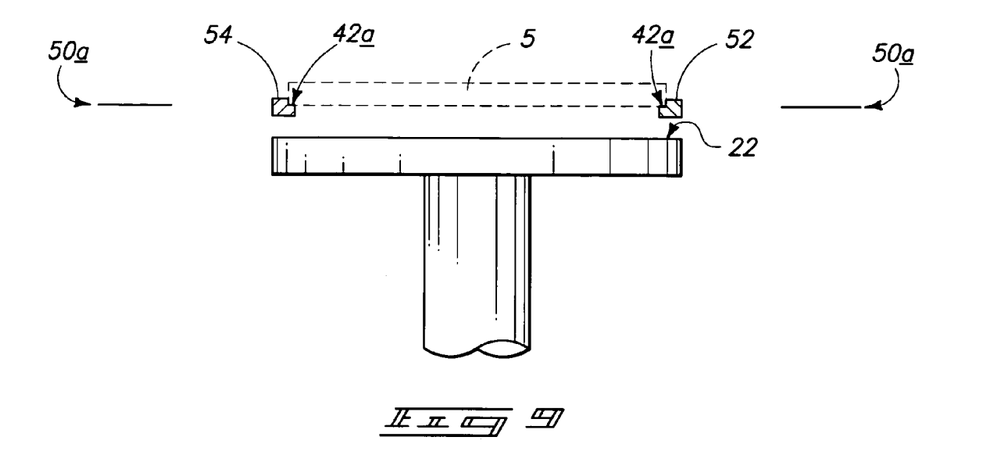
FIG. 9 is a diagrammatic sectional view taken through line 9-9 in FIG. 6.
Figure 10:
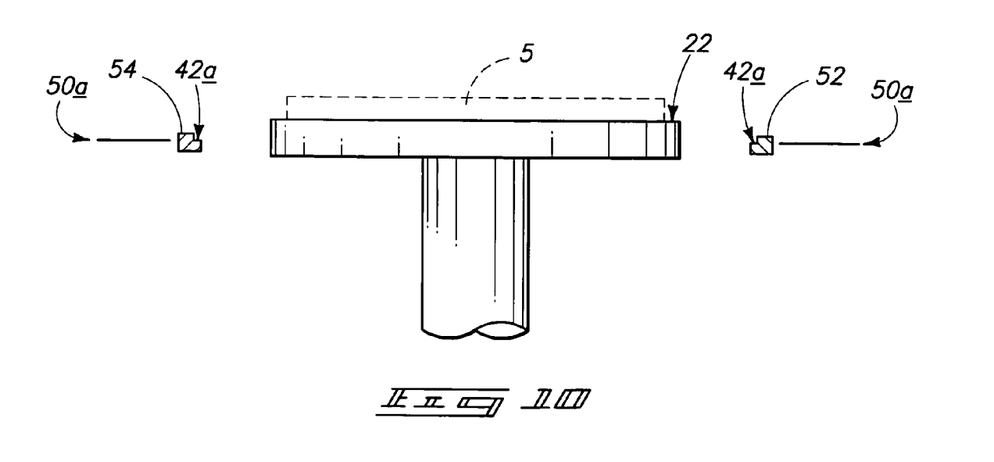
FIG. 10 is a diagrammatic sectional view taken through line 10-10 in FIG. 7.

Referring to FIG. 9, in one preferred implementation, individual engagement arms 52 and 54 comprise at least some portion configured to contact an individual workpiece when engaging the workpiece, for example arcuate ledges 42a. For example, FIG. 9 depicts a workpiece 5 received atop ledges 42a of a pair of first and second engagement arms 52, 54, respectively. Ledges 42a, or other analogous portion, are movable in at least one plane 50a between a position received at least partially over individual of the pedestals (i.e., FIGS. 6 and 9) and a position displaced away from over all of the pedestals (i.e., FIGS. 7 and 10). In one preferred embodiment, the pedestals are configured for moving the upper surface of the pedestals at least to plane 50a, and in one preferred embodiment upwardly movable through said plane as shown in FIG. 10 and analogous to the preferred implementation further exemplified in the first embodiment relative to FIG. 4.

Figure 11:
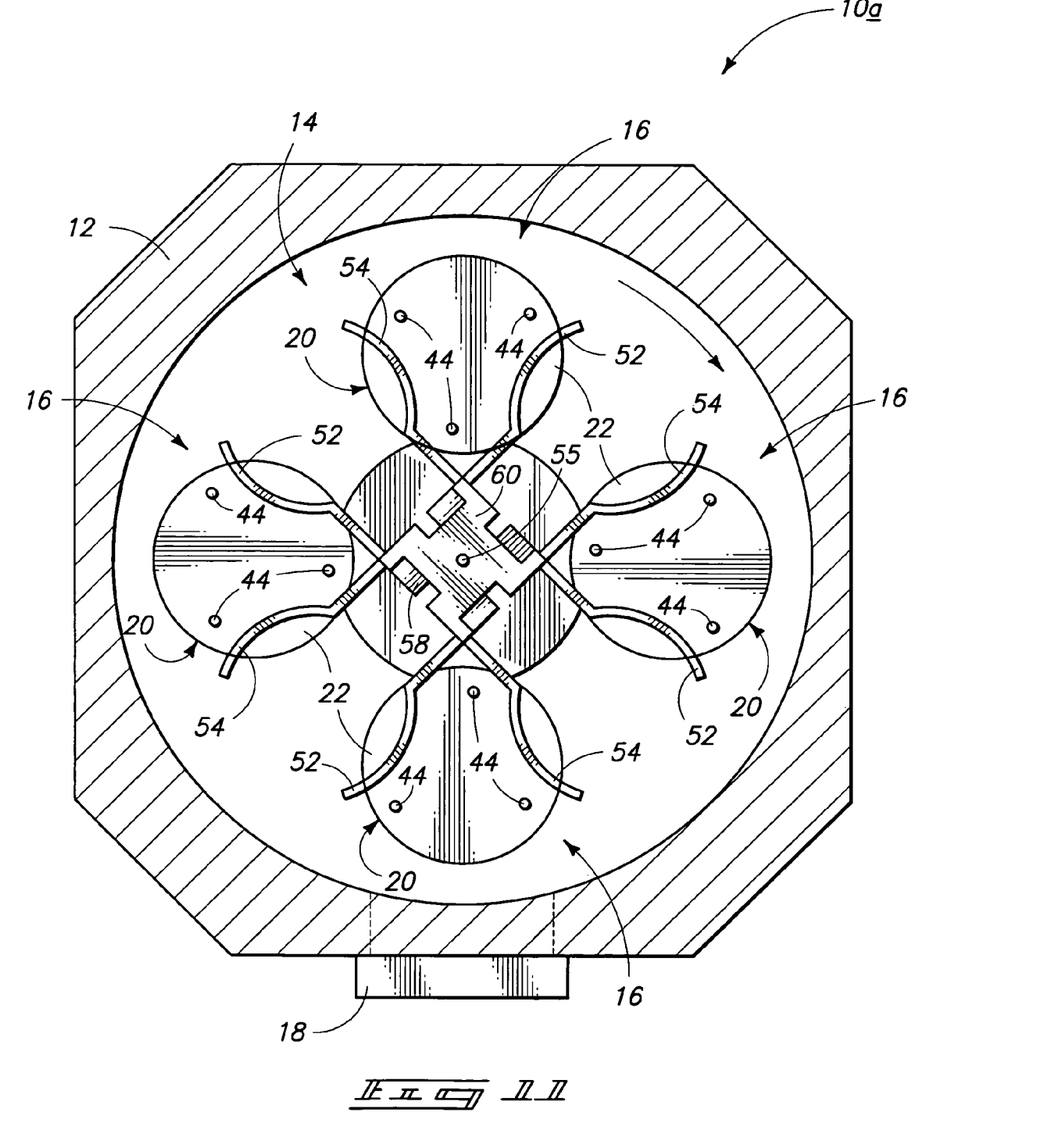
FIG. 11 is a view of the FIG. 6 processor in a different operational orientation to that depicted by FIG. 6.

FIG. 6 depicts an exemplary orientation of processor 10a whereby central plates 58 and 60 are positioned in closed or inward orientations for receipt of individual workpieces. Such is the position when the preferred exemplary embodiment first and second engagement arms are configured for movement together in unison to move workpieces from one of the stations to another of the stations. For example, FIG. 11 depicts exemplary rotational movement of the first and second plates and associated first and second engagement arms in unison between pedestals 20.

FIG. 7 depicts exemplary alternate rotational orientation from that of FIG. 6. Specifically, first central plate 58 has been rotated counterclockwise and second central plate 60 has been rotated clockwise to displace the respective engagement arms away from being received over pedestals 20. Such moving action might occur simultaneously, sequentially, overlapping in time, or otherwise. Lift pins 44 preferably associated with pedestals 20 are again ideally constructed to be in a position which avoids any potential interference with the first and second engagement arms when the lift pins are in a raised position. In one implementation, first and second central plates 58 and 60 comprise at least two outer edge surfaces configured to vertically align when the first and second engagement arms are configured for movement together in unison to move workpieces from one of the stations to another of the stations (FIGS. 6 and 11). Such outer edges do not vertically align when in at least one other orientation (i.e., FIG. 7).

In one exemplary implementation, an aspect of the invention contemplates a multi-station workpiece processor, for example and by way of example only as depicted by processor 10a. Such a processor includes a processing chamber comprising multiple stations for processing individual workpieces. A pedestal is associated with individual of the stations, and independent of whether such pedestals are mounted for selective vertical up movement within the chamber to contact a workpiece and independent of whether such pedestals are mounted for selective vertical down movement within the chamber to be displaced from a workpiece. In other words, the pedestals might be fixed in a stationary position to not be selectively/remotely movable by an operator, or configured for other movement in one implementation. However most preferably, such pedestals are mounted for such selective vertical up and down movement.

Such a processor in one implementation also includes first and second engagement arms associated with individual of the stations. The first engagement arms are configured to engage respective first side portions of individual workpieces received over the pedestals. The second engagement arms are configured to engage respective second side portions opposite the first side portions of the individual workpieces as received over the pedestals. The first and second engagement arms are configured for movement together in unison to move workpieces from one of the stations to another of the stations, and independent of whether the first and second engagement arms are movable to be displaced away from over all of the pedestals. However most preferably, such first and second engagement arms are configured to be movable to be displaced away from over all of the pedestals as shown and described.

Figure 12:
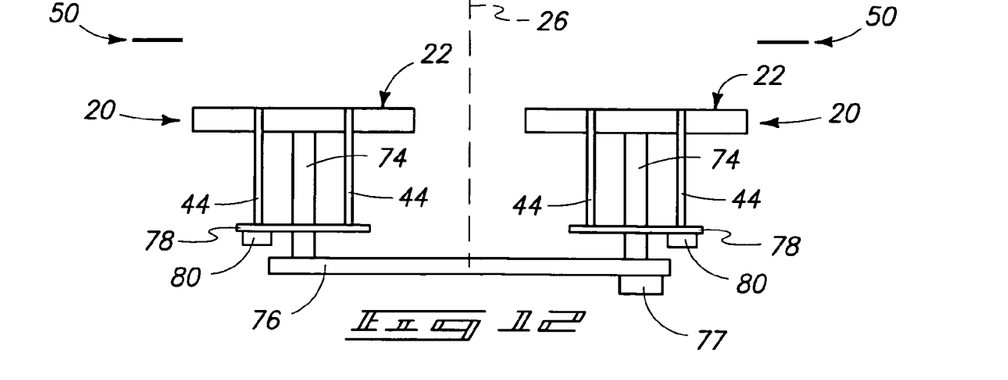
FIG. 12 is a diagrammatic elevational view of possible aspects of the FIG. 1 processor construction in one operational orientation.
Figure 13:
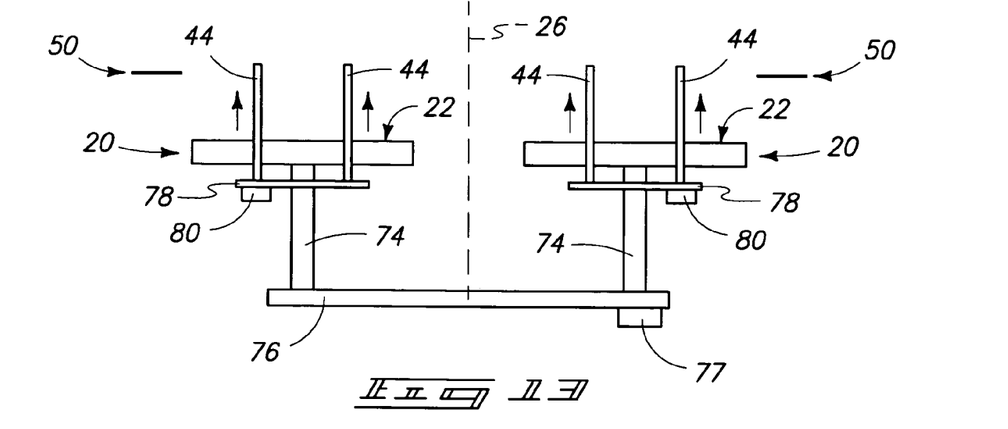
FIG. 13 is a view of the FIG. 12 processor in another operational orientation.
Figure 14:
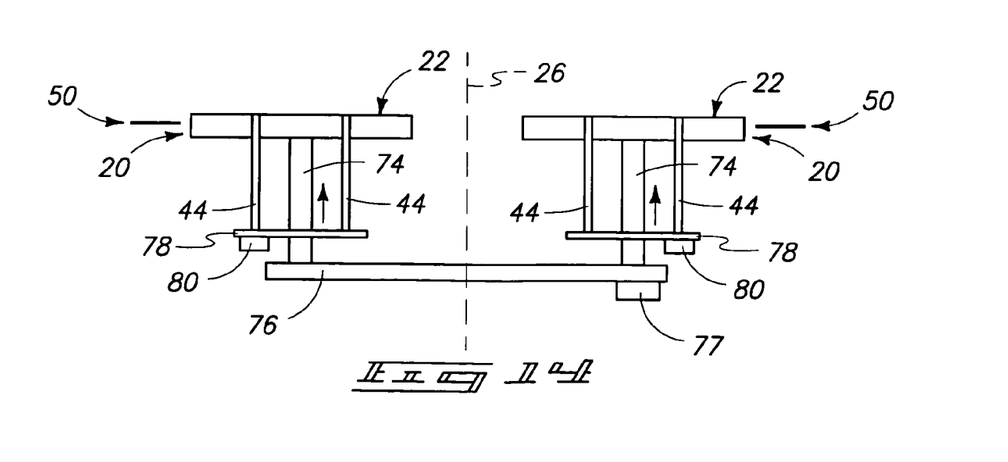
FIG. 14 is a view of the FIG. 12 processor in yet another operational orientation.

By way of example only, FIGS. 12-14 depict but one exemplary embodiment depicting exemplary methods of how lift pins 44 and pedestals 20 might be constructed and mounted for vertical movements relative to and independent of one another. Such depict an embodiment where all lift pins can be mounted for vertical movement in unison with one another. Such implementation also depicts an embodiment wherein all pedestals are mounted for vertical movement in unison with one another, yet capable of independent movement relative to the lift pins. Alternate configurations are also of course contemplated, and regardless of the respective independent and unison movements. FIGS. 12-14 are diagrammatic only and do not directly correspond to any straight line cross-section of FIGS. 1 and 2.

Pedestals 20 are depicted as being supported by respective vertical shafts 74. Such are engaged by a horizontal plate member 76. A suitable mechanism 77 (i.e., electric, pneumatic, or otherwise) engages horizontal plate member 76 for selectively moving pedestals 20 through vertical support members 74 for selective vertical up and down movements.

An exemplary pair of lift pins 44 is shown with respect to each pedestal 20. Such are received in FIG. 12 such that uppermost ends of pins 44 are flush or below uppermost surfaces 22 of pedestals 20. Lower ends of lift pins 44 engage with a horizontal plate member 78. Different horizontal plate members 78 are depicted as being associated with each pedestal 20. Alternately by way of example only, a single horizontal plate member might be associated and connected with all lift pins 44. Other constructions are, again, of course contemplated. Horizontal plate members 78 include holes extending therethrough through which vertical pedestal shafts 74 are slidably received. A suitable drive mechanism 80 is diagrammatically illustrated and included for elevationally raising and lowering horizontal plate 78 and correspondingly lift pins 44.

FIG. 12 depicts one exemplary operational orientation wherein the pedestals and lift pins are each received elevationally below horizontal plane 50. FIG. 13 depicts an exemplary operational orientation wherein lift pins 44 have been lifted such that their uppermost ends are received elevationally above plane 50, for example as might occur in lifting a workpiece (not shown) out of plane 50 to displace a workpiece above the engagement arms (not shown).

FIG. 14 depicts another exemplary operational orientation wherein pedestals 20 have been raised relative to the orientation of FIG. 13 such that upper surfaces 22 thereof are coincident with or above the uppermost ends of lift pins 44, for example to engage the underside surfaces of workpieces previously engaged by lift pins in the position of FIG. 13. Such constructions and operational orientations are exemplary only, and other constructions and operational orientations are also of course contemplated.

Other aspects of the invention include various methods of processing semiconductor workpieces within a multi-station workpiece processor, for example using any of the processors as described above or using other processors. Regardless, in one preferred methodical implementation, individual semiconductor workpieces are positioned over individual pedestals within a multi-station processing chamber with at least one workpiece engagement arm associated with individual of the workpieces. For example, a semiconductor workpiece could be transferred by a suitable robot arm (not shown) through access port 18 to be received by an arm 25 most proximate access opening 18 with respect to the FIG. 1 embodiment. Likewise, a suitable robot arm could be utilized to position a semiconductor workpiece through access opening 18 over first and second engagement arms 52, 54, respectively, in the FIG. 6 embodiment. Thereafter, and by way of example only, the arms can be rotated together 90° clockwise or counterclockwise, and another semiconductor workpiece positioned over the next arm or arms received most proximate access opening 18. The process can be repeated if desired until a workpiece is received by the arms over each of the individual pedestals. Of course, more access ports might be utilized and processing conducted accordingly to position the desired number of semiconductor workpieces over the respective pedestals.

In the depicted above FIG. 1 and FIG. 6 embodiments, a portion of each engagement arm is received over a respective of the pedestals. Lift pins associated with individual of the pedestals are raised effective to engage respective undersides of the workpieces positioned thereover and lift the individual workpieces off of the engagement arms. In one preferred embodiment, all of the lift pins are so raised in unison which respect to all pedestals. After lifting the workpieces off of the engagement arms, the engagement arms are moved away from the workpieces, and in one preferred embodiment wherein all of the engagement arms are displaced from being received over all of the pedestals. For example, and by way of example only, FIGS. 2 and 7 depict exemplary such engagement arm actions.

After lifting the workpieces off of the engagement arms, the pedestals are raised effective to contact the respective undersides of the individual workpieces and rest the workpieces onto the pedestals. Accordingly in one implementation, such lifting pins might remain entirely stationary while only the pedestals move upwardly relative thereto. Further preferably and as described, the engagement arms are moved away from the workpieces prior to raising the pedestals to preclude interference of the pedestals relative to the engagement arms. Further in one preferred embodiment, the raising of the pedestals is in unison with respect to all of the pedestals.

After resting the workpieces onto the pedestals, the workpieces are processed within the processing chamber, for example relative to the station within which each is received. The pedestals might remain in their position where the workpieces were engaged or, by way of example only, be moved further upward or moved downward for such processing.

Another aspect of the invention contemplates a method of moving semiconductor workpieces within a multi-station workpiece processor, and including independent of the just-described method. Such a method of moving semiconductor workpieces within a multi-station workpiece processor encompasses resting individual semiconductor workpieces onto individual pedestals within a multi-station processing chamber. For example and by way of example only, the above methodical processing is but one exemplary manner by which individual semiconductor workpieces can be rested/placed onto individual pedestals.

The pedestals are thereafter lowered relative to lift pins associated with the individual pedestals effective to contact and support undersides of the workpieces by the lift pins above the pedestals. Accordingly and by way of example only with respect to the just-described embodiment, the lift pins might remain entirely stationary relative to the pedestals, and the pedestals lowered relative to the lift pins thereby supporting the individual workpieces above the pedestals. Further in one preferred embodiment, the lowering of the pedestals is in unison with respect to all of the pedestals.

After lowering the pedestals, at least a portion of at least one workpiece engagement arm associated with individual of the workpieces is moved to underneath the individual workpieces. After such movement, the lift pins are lowered effective to rest the workpieces on the engagement arms. After resting the workpieces on the engagement arms, the workpieces are moved with the engagement arms within the processing chamber. For example, and by way of example only, such could be moved to another station for subsequent processing or moved to proximate access port 18 for ultimate removal from the processor.

Another aspect of the invention encompasses a method of processing semiconductor workpieces within a multi-station workpiece processor. Individual semiconductor workpieces are positioned over individual pedestals within a multi-station processing chamber with opposing pairs of first and second engagement arms associated with individual of the workpieces. The first engagement arms engage respective first side portions of the individual workpieces, and the second engagement arms engage respective second side portions of the individual workpieces opposite the first side portions. By way of example only, FIGS. 6 and 9 depict such an exemplary orientation of exemplary first and second engagement arms when semiconductor workpieces might be received thereby.

After such positioning, individual workpieces are lifted off of the first and second engagement arms with lift pins associated with the individual pedestals. After such lifting, the first engagement arms are moved in unison relative to one another in one of a clockwise or counterclockwise direction away from the workpieces, and perhaps independent of whether such movement entirely clears such engagement arms from being received over the pedestals. Further after such lifting, the second engagement arms are moved in unison relative to one another in the other of clockwise or counter-clockwise direction away from the workpieces, and perhaps independent of whether such engagement arms are moved to be clear of being received over any of the pedestals. Such acts of moving the first and second engagement arms might occur simultaneously, or might occur at different times and independent of movement of the other of the first and second engagement arms.

Regardless, respective undersides of the workpieces are rested onto individual of the pedestals. Such resting might comprise lowering the pins relative to the pedestals, raising the pedestals relative to the pins, or some combination thereof.

After resting the workpieces onto the pedestals, the workpieces are processed within the processing chamber in some manner.

The Chinese priority application to this patent application is of course incorporated by reference herein.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A multi-station workpiece processor, comprising:
   a processing chamber comprising multiple stations for processing individual workpieces;
   a plurality of pedestals, each pedestal associated with individual of the stations, the pedestals being mounted for selective vertical up movement within the chamber to contact a workpiece and for selective vertical down movement within the chamber to be displaced from a workpiece, each of the pedestals respectively comprising an upper surface upon which an individual workpiece is received during processing within the chamber, each of the pedestals further comprising a plurality of lift pins mounted for vertical up and down movement independent of the movement of the respective pedestal; and
   at least one workpiece engagement arm associated with individual of the pedestals, the workpiece engagement arms being movable between a position received at least partially over individual of the pedestals and a position displaced away from over all of the pedestals.

2. The processor of claim 1 wherein the individual engagement arms comprise at least some portion configured to contact an individual workpiece when engaging the workpiece, the portion being movable in at least one plane between a position received at least partially over individual of the pedestals and a position displaced away from over all of the pedestals, the upper surfaces of the pedestals being upwardly movable at least to said plane.

3. The processor of claim 2 wherein the upper surfaces of the pedestals are upwardly movable through said plane.

4. The processor of claim 1 comprising only one workpiece engagement arm per pedestal.

5. The processor of claim 4 wherein the engagement arms are mounted for rotation about an axis of rotation, the individual engagement arms comprising a first portion extending generally radially relative to the axis of rotation and a second portion extending generally perpendicular to the axis of rotation.

6. The processor of claim 5 comprising a slot intermediate the first and second portions.

7. The processor of claim 4 wherein the individual engagement arms comprise a plurality of upwardly projecting workpiece engaging portions.

8. The processor of claim 4 wherein the individual engagement arms comprise at least some portion configured to contact an individual workpiece when engaging the workpiece, the portion being movable in at least one plane between a position received at least partially over individual of the pedestals and a position displaced away from over all of the pedestals, the upper surfaces of the pedestals being upwardly movable at least to said plane.

9. The processor of claim 1 comprising at least two workpiece engagement arms per pedestal.

10. The processor of claim 9 wherein the individual engagement arms comprise at least some portion configured to contact an individual workpiece when engaging the workpiece, the portion being movable in at least one plane between a position received at least partially over individual of the pedestals and a position displaced away from over all of the pedestals, the upper surfaces of the pedestals being upwardly movable at least to said plane.

11. The processor of claim 1 comprising two workpiece engagement arms per pedestal, firsts of such arms being configured to engage respective first side portions of individual workpieces, seconds of such arms being configured to engage respective second side portions of the individual workpieces which are opposite the first side portions, the first and second engagement arms comprising respective arcuate shaped portions configured to engage said side portions.

12. The processor of claim 11 wherein the arcuate shaped portions comprise recessed arcuate ledges sized to engage respective undersides of outermost edges of the individual workpieces.

13. The processor of claim 12 wherein the arcuate ledges are mounted for movement in at least one plane between a position received at least partially over individual of the pedestals and a position displaced away from over all of the pedestals, the upper surfaces of the pedestals being upwardly movable at least to said plane.

14. The processor of claim 1 wherein the pedestals are mounted for vertical up and down movements in unison with one another.

15. The processor of claim 1 wherein the pedestals are mounted to be capable of vertical up and down movements independent of one another.

16. The processor of claim 1 comprising a respective plurality of lift pins associated with individual of the pedestals.

17. The processor of claim 16 wherein the respective pluralities of lift pins are mounted for vertical up and down movements.

18. The processor of claim 17 wherein all lift pins are mounted for vertical up and down movements in unison with one another.

19. The processor of claim 18 comprising a horizontal plate positioned to engage ends of the lift pins for the vertical up and down movements in unison with one another.

20. The processor of claim 17 wherein the respective pluralities of lift pins are mounted for vertical up and down movements independent of vertical up and down movements of the pedestals.

21. The processor of claim 20 wherein all lift pins are mounted for vertical up and down movements in unison with one another.

22. The processor of claim 21 comprising a horizontal plate positioned to engage ends of the lift pins for the vertical up and down movements in unison with one another.

23. A multi-station workpiece processor, comprising:
a processing chamber comprising multiple stations for processing individual workpieces;
a pedestal associated with individual of the stations, the pedestals being mounted for selective vertical up movement within the chamber to contact a workpiece and for selective vertical down movement within the chamber to be displaced from a workpiece, the pedestals respectively comprising an upper surface upon which an individual workpiece is received during processing within the chamber;
at least one workpiece engagement arm associated with individual of the pedestals, the workpiece engagement arms being movable between a position received at least partially over individual of the pedestals and a position displaced away from over all of the pedestals; and,
two independently movable workpiece engagement arms per pedestal, firsts of such arms being configured to engage respective first side portions of individual workpieces, seconds of such arms being configured to engage respective second side portions of the individual workpieces which are opposite the first side portions.

24. The processor of claim 23 wherein the firsts and seconds of such arms comprise recessed ledges sized to engage respective undersides of outermost edges of the individual workpieces.

25. The processor of claim 24 wherein the ledges are mounted for movement in at least one plane between a position received at least partially over individual of the pedestals and a position displaced away from over all of the pedestals, the upper surfaces of the pedestals being upwardly moveable at least to said plane.

26. A multi-station workpiece processor, comprising:
a processing chamber comprising multiple stations for processing individual workpieces;
a pedestal associated with individual of the stations; and
first and second engagement arms associated with individual of the stations, the first engagement arms being configured to engage respective first side portions of individual workpieces received over the pedestals, the second engagement arms being configured to engage respective second side portions opposite the first side portions of the individual workpieces received over the pedestals, the first and second engagement arms being configured for movement together in unison to move workpieces from one of the stations to another of the stations, the first engagement arms being configured for movement relative to the second engagement arms, the second engagement arms being configured for movement relative to the first engagement arms.

27. A method of processing semiconductor workpieces within a multi-station workpiece processor, comprising:
positioning individual semiconductor workpieces over individual pedestals within a multi-station processing chamber with at least one workpiece engagement arm associated with individual of the workpieces;
raising lift pins associated with individual of the pedestals effective to engage respective undersides of the workpieces positioned thereover and lift the individual workpieces off of the engagement arms;
after lifting the workpieces off of the engagement arms, moving the engagement arms away from the workpieces;
after lifting the workpieces off of the engagement arms, raising the pedestals effective to contact the respective undersides of the individual workpieces and rest the workpieces onto the pedestals; and
after resting the workpieces onto the pedestals, processing the workpieces within the processing chamber.

28. A method of moving semiconductor workpieces within a multi-station workpiece processor, comprising:
resting individual semiconductor workpieces onto surfaces of individual pedestals within a multi-station processing chamber;
lowering the pedestals relative to lift pins associated with the individual pedestals effective to contact and support undersides of the workpieces by the lift pins above the surfaces of the pedestals;
after lowering the pedestals, moving at least a portion of at least one workpiece engagement arm associated with individual of the workpieces to underneath the individual workpieces;
after moving at least a portion of the workpiece engagement arms to underneath the individual workpieces, lowering the lift pins effective to rest the workpieces on the engagement arms; and
after resting the workpieces on the engagement arms, moving the workpieces with the engagement arms within the processing chamber.

29. A method of processing semiconductor workpieces within a multi-station workpiece processor, comprising:
positioning individual semiconductor workpieces over individual pedestals within a multi-station processing chamber with opposing pairs of first and second engagement arms associated with individual of the workpieces, the first engagement arms engaging respective first side portions of the individual workpieces, the second engagement arms engaging respective second side portions of the individual workpieces opposite the first side portions;
after the positioning, lifting the individual workpieces off of the first and second engagement arms with lift pins associated with the individual pedestals;
after lifting the individual workpieces off of the first and second engagement arms, moving the first engagement arms in unison relative to one another in one of clockwise or counterclockwise direction away from the workpieces;
after lifting the individual workpieces off of the first and second engagement arms, moving the second engagement arms in unison relative to one another in the other of clockwise or counterclockwise direction away from the workpieces;
resting respective undersides of the workpieces onto the individual pedestals; and
after resting the workpieces onto the pedestals, processing the workpieces within the processing chamber.

* * * * *